United States Patent [19]
Ozeki et al.

[11] Patent Number: 4,987,606
[45] Date of Patent: Jan. 22, 1991

[54] WIDE BAND TRANSMISSION SYSTEM WITH BIASING OF GAIN CONTROL CIRCUIT

[75] Inventors: Hiroaki Ozeki, Neyagawa; Seiji Sakashita, Yahata; Ippei Kanno, Hirakata, all of Japan

[73] Assignee: Matsushita Electric Industrial Co., Ltd., Osaka, Japan

[21] Appl. No.: 287,088

[22] Filed: Dec. 21, 1988

[51] Int. Cl.⁵ .............................................. H04B 1/16
[52] U.S. Cl. ................................. 455/188; 455/191; 455/200; 455/247
[58] Field of Search ................. 455/3, 6, 234, 188, 455/191, 200, 246, 247, 340; 358/86

[56] References Cited

U.S. PATENT DOCUMENTS

| | | | |
|---|---|---|---|
| 2,275,389 | 3/1942 | Feldman | 455/247 |
| 3,005,094 | 10/1961 | Taylor | 455/246 |
| 4,048,598 | 9/1977 | Knight | 455/191 |
| 4,403,346 | 9/1983 | Ogawa | 455/200 |
| 4,418,427 | 11/1983 | Muterspaugh | 455/191 |
| 4,619,000 | 10/1986 | Ma | 455/340 |
| 4,792,993 | 12/1988 | Ma | 455/340 |
| 4,811,423 | 3/1989 | Eastmond | 455/247 |

FOREIGN PATENT DOCUMENTS 63-211821 2/1987 Japan.

OTHER PUBLICATIONS

Wide Band Tuner, Double Conversion Tuner, Consumer Products Research Centre, Hitachi, Ltd., pp. 49-54.
Wide Band Double Conversion TV Tuner, Tohru Kasanami, Seiichi Arai, Kazunari Kawahata, Murata Mfg. Co., Ltd., pp. 25-30.

*Primary Examiner*—Gerard R. Strecker
*Assistant Examiner*—Lisa Charouel
*Attorney, Agent, or Firm*—Wenderoth, Lind & Ponack

[57] ABSTRACT

There is provided a wide band transmission system which, by using two or more filters and gain control circuits, is operated so as to determine the gain control amount of the gain control circuits according to an intensity and frequency band of a signal which is desired to be received. Further, a bias circuit increases the attenuation amount of the gain control circuit connected to the filter whose pass band is out of the band of the desired signal.

15 Claims, 7 Drawing Sheets

WIDE BAND TRANSMISSION SYSTEM WITH BIASING OF GAIN CONTROL CIRCUIT

BACKGROUND OF THE INVENTION

1. Field of the Invention

The present invention relates to a receiving circuit to be used for television receivers and CATV tuners.

2. Description of the Prior Art

In recent years, with the adoption of multi-channel CATV, wide band receiving has been necessitated. An example of tuners for such wide band receiving is shown in "Wide Band Multi-channel Tuner", Sato, et al., ITEJ (the Institute of Television Engineers of Japan) Technical Report, RE86-6, Feb. 27, 1986. In the said tuner, two or more filters are changed over with a filter selection switch to limit the number of channels to be inputted into the amplifier circuit or mixer circuit, and gain control is effected with an attenuator after the filter selection switch. According to the above construction, however, when the gain of the tuner is the maximum, the noise figure is deteriorated by insertion losses caused by the filter selection switch and the attenuator.

SUMMARY OF THE INVENTION

An object of the present invention is to provide a wide band transmission system having excellent distortion characteristics and a favorable noise figure.

According to the present invention, a filter for receiving a channel to be received is selected by a gain controller, and the gain control amount of the gain controller is varied by the intensity of the signal which is to be received. Further, a bias circuit controls another gain controller for controlling another filter for receiving another channel so as to further increase the gain control amount of another gain controller so that the desired channel is not received by another filter.

Figure 1:
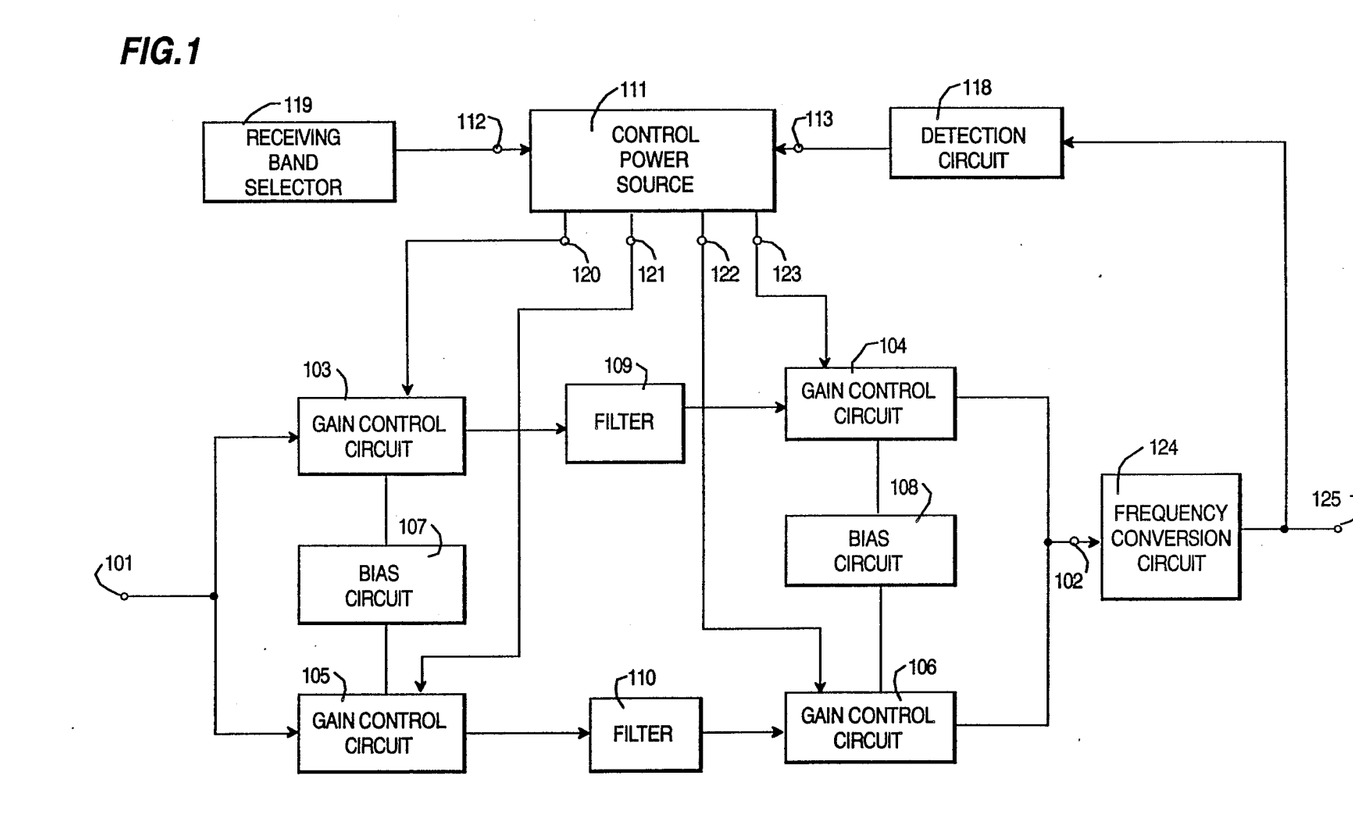
FIG. 1 is a block diagram of a wide band transmission system of one embodiment of the present invention.

DESCRIPTION OF THE PREFERRED EMBODIMENTS:

In FIG. 1, a filter 109 is a band-pass filter of 50 MHz~470 MHz, and a filter 110 is a band-pass filter of 470 MHz~800 MHz. Into an input terminal 101, a CATV signal is inputted. Hereinafter; an explanation will be set forth regarding the case where the signal which is desired to be received is within the pass band of the filter 109.

By a band selection voltage having one of two levels of "low" and "high" and supplied to a terminal 112 from a known receiving band selector 119 and an AGC voltage supplied to a terminal 113 according to the intensity of the signal which is desired to be received, control signals for controlling the attenuation amounts of gain control circuits 103, 104, 105 and 106 are generated at terminals 120, 121, 122, and 123 of a control power source 111. The attenuation amounts of the gain control circuits 106 and 105 are increased. The attenuation amounts of the gain control circuits 103 and 104 are proportional to the intensity of the signal which is desired to be received. Therefore, there can be obtained at a terminal 102 a signal which is desired to be received and having a certian intensity with removal of the signals of 470 MHz~850 MHz. The signal which is desired to be received at the terminal 102 is converted into an intermediate frequency signal by a frequency conversion circuit 124 and outputted from a terminal 125. The signal is detected by a detection circuit 118, which produces a voltage proportionate to the intensity of the signal which is desired to be received as the AGC voltage at the terminal 113.

A bias circuit 107 increases the attenuation amount of the gain control circuit 105 to be larger than the attenuation amount obtainable with the control power souce 111 according to the gain control amount of the gain control circuit 103. In the bias circuit 108 as well, the attenuation amount of the gain control circuit 106 is made larger than the attenuation amount with the control power source 111 according to the gain control amount of the gain control circuit 104.

Figure 9:
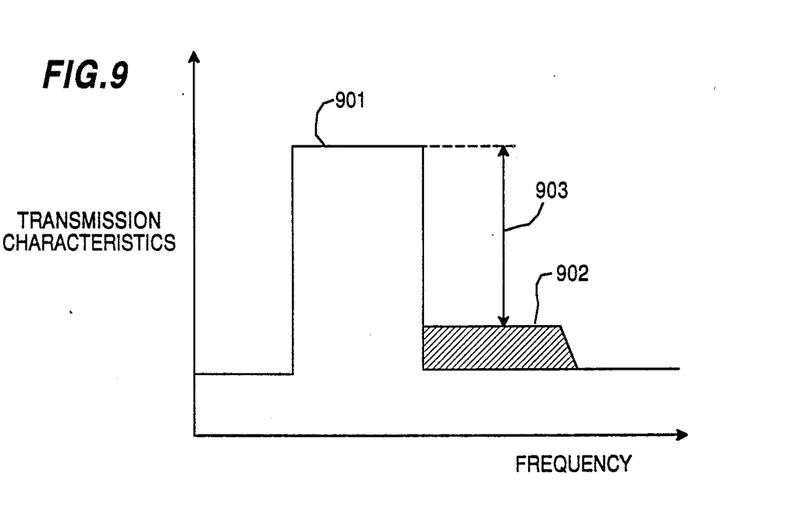
FIG. 9 is a diagram to illustrate the operation of the bias circuit.

The operation of the abovementioned bias circuit 107 is explained with reference to FIG. 9. The characteristic between the terminals 101 and 102 are a sum of a passing characteristic 901 of the gain control circuit 103, filter 109, and gain control circuit 104 and a passing characteristic 902 of the gain control circuit 105, filter 110, and gain control circuit 106. In FIG. 9, the attenuation amounts of the gain control circuits 103 and 104 are made the smallest. When the intensity of the signal which is desired to be received exerted to the terminal 101 is large, due to the increase of the attenuation amounts of the gain control circuits 103 and 104, the level difference 903 is reduced. Accordingly, as aforedescribed, by increasing the attenuation amounts of the gain control circuits 105 and 106 according to the attenuation amounts of the gain control circuits 103 and 107 by the bias circuits 109 and 108, a tendency of the level difference 903 to become small is suppressed.

In the range in which the attenuation amounts of the gain control circuits 103 and 104 are small, the level difference 903 does not become much smaller. Therefore, the bias circuit may be omitted.

In the above, a description has been made on set forth in the case where the signal which is desired to be received is within the pass band of the filter 109. The same applies to the case where the signal which is desired to be received is within the pass band of the filter 110.

Figure 2:
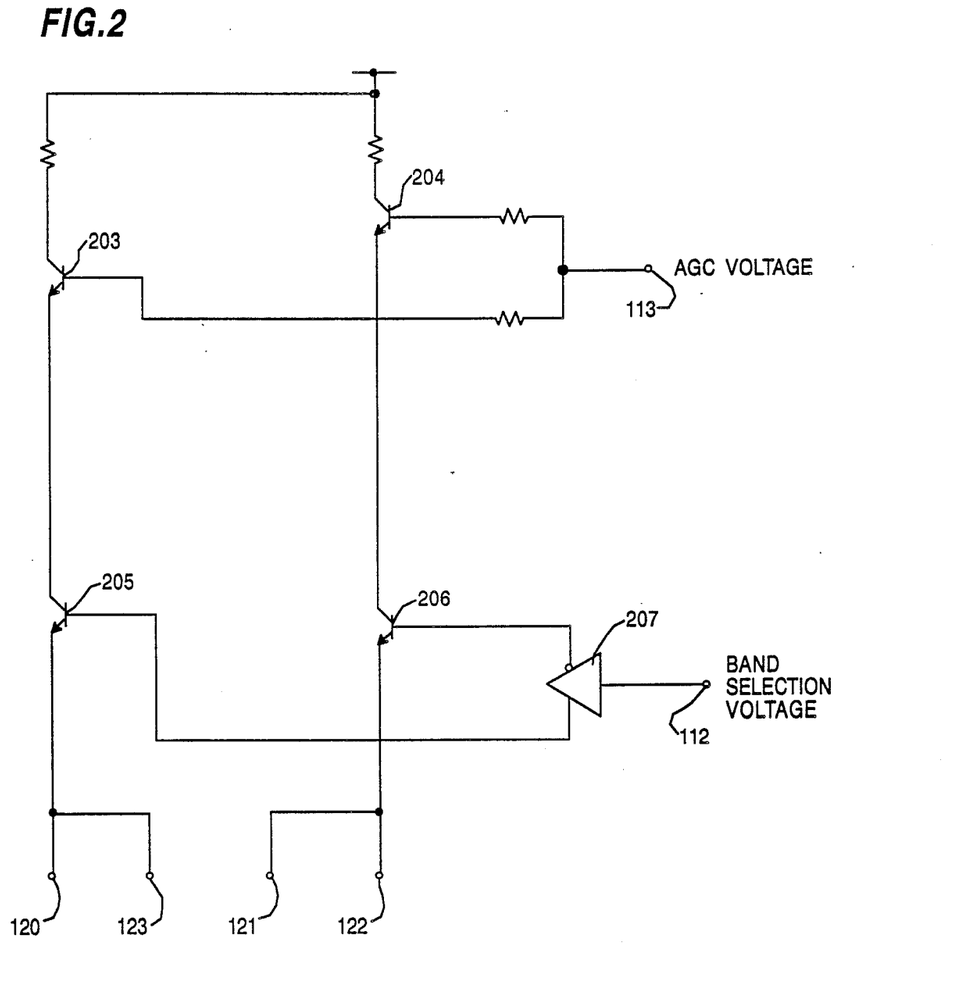
FIG. 2 is a circuit diagram of one embodiment of the control power source shown in FIG. 1.

FIG. 2 shows an example of the control power source of FIG. 1. To the terminal 112 a band selection voltage of either a "high" or "low" level is supplied from the receiving band selector 119. When the band selection voltage is at "high" level, a transistor 205 turns ON and a transistor 206 turns OFF by a buffer 207. Then, an AGC voltage is supplied to the terminal 113, by which the base potential of a transistor 203 is varied, so that the current flowing through the transistor 203 is determined and supplied to the gain control circuits 103 and 104 through the terminals 120 and 121.

When the band selection voltage is "low", the transistor 206 turns ON and the transistor 205 turns OFF by the buffer 207. Then, and AGC voltage is supplied to the terminal 113, by which the current flowing through a transistor 204 is determined and supplied to the gain control circuits 105 and 106 through the terminals 121 and 122.

Figure 3:
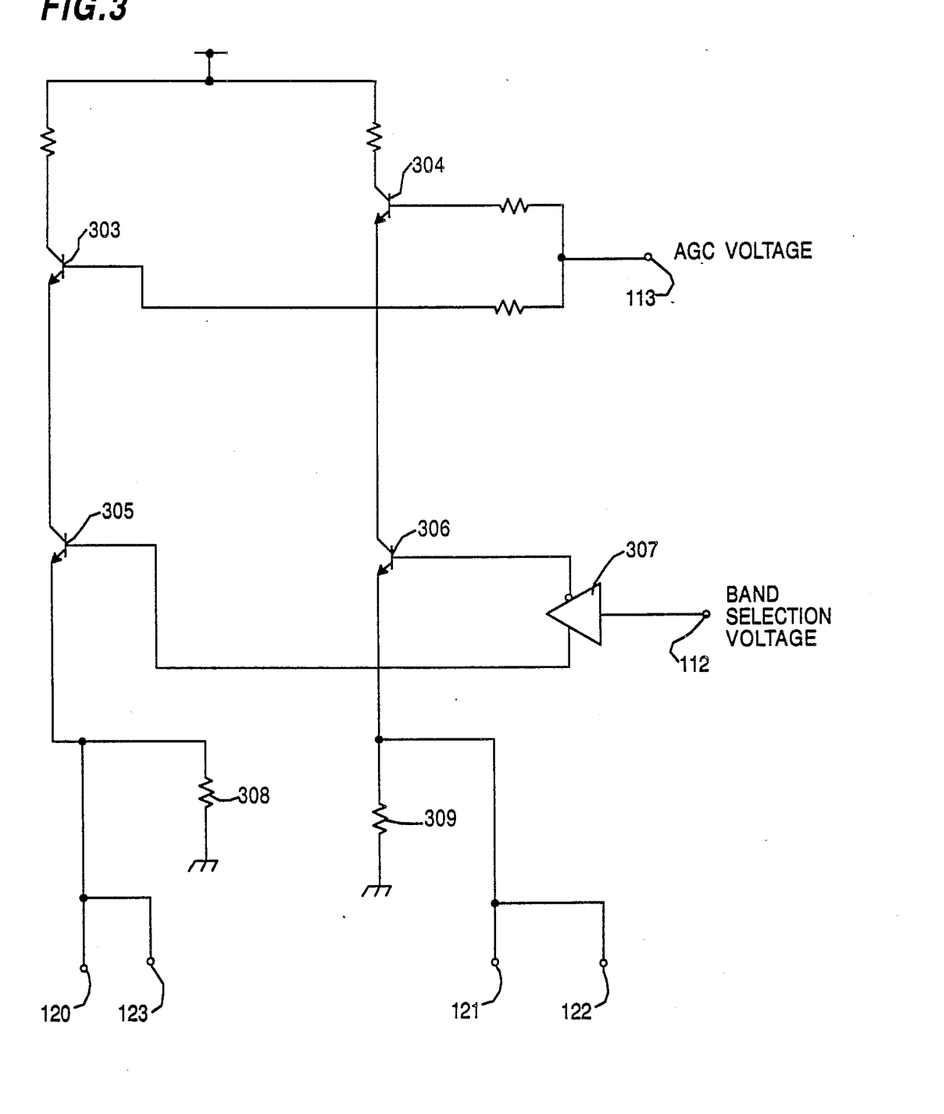
FIG. 3 is a circuit diagram of another embodiment of the control power source shown in FIG. 1.

FIG. 3 shows another embodiment of the control power source of FIG. 1. To the terminal 112 a band selection voltage of either "high" or "low" level is supplied from the receiving band selector 119. When the band selection voltage is "high", a transistor 305 turns ON and a transistor 306 turns OFF by a buffer 307. Then, an AGC voltage is supplied to the terminal 113, by which the base potential of a transistor 303 is varied, and the current flowing through the transistor 303 is determined. The current is converted into a voltage by a resistor 308 and supplied to the gain control circuits 103 and 104 from the terminals 120 and 123. When the band selection voltage is "low", the transistor 306 turns ON and the transistor 305 turns OFF by the buffer 307. Then, an AGC voltage is supplied to the terminal 113, by which the base potential of a transistor 304 is varied, and the current flowing through the transistor 304 is determined. The current is converted into a voltage by a resistor 309 and supplied to the gain control circuits 105 and 106 from the terminals 121 and 122.

Figure 4:
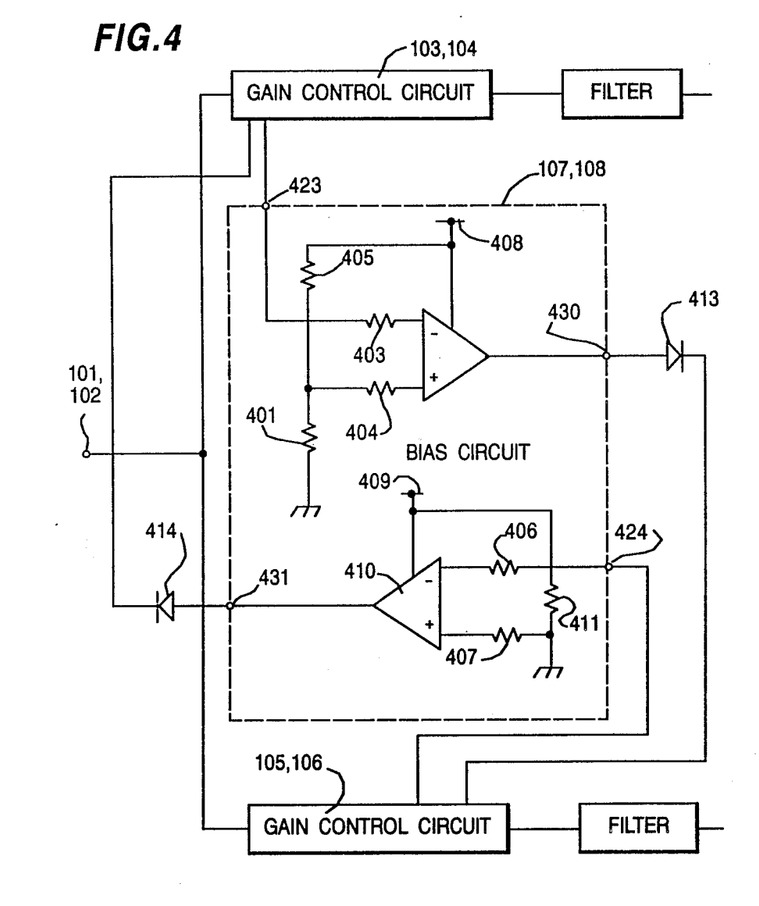
FIG. 4 is a circuit diagram of one embodiment of the bias circuit shown in FIG. 1.

FIG. 4 shows an embodiment of the bias circuit 107 of FIG. 1. A first subtraction circuit is constituted by a power source 408, and operational amplifier 402, and resistors 403, 404. A second subtraction circuit is constituted by a power source 409, and operational amplifier 410, and resistors 406, 407.

Firstly, when the gain control circuits 103, 104 are connected to the band-pass filter in which the signal which is desired to be received exists within the pass band and the gain control circuits 105, 106 are connected to the band-pass filter in which the signal which is desired to be received does not exist within the pass band, assuming the potential of a terminal 423 to be V1, the output potential of the operational amplifier 402 to be V2, and the potential obtained by dividing the operating power source 408 of the operational amplifier 402 by resistors 405, 401 to be V3, the relation among V1, V2 and V3 can be expressed by:

$$V2 = V3 - V1.$$

Accordingly, when the potential to be supplied from the gain control circuits 103, 104 to the terminal 423 is lowered according to the increase in the gain control amount, the potential V2 becomes higher, so that a bias is given so as to increase the attenuation amounts of the gain control circuits 105, 106 through a terminal 430 and a diode 413. At this time, the diode 413 is inserted so as to prevent the flow of current from the gain control circuits 105, 106 to the operational amplifier 402.

Then, when the gain control circuits 105, 106 are connected to the filter in which the signal which is desired to be received exists within the pass band and the gain control circuits 103, 104 are connected to the filter in which the signal which is desired to be received does not exist within the pass band, assuming the potential of a terminal 424 to be V4, the output potential of the operational amplifier 410 to be V5, and the potential obtained by dividing the operating power source 409 of the operational amplifier 410 by resistors 411, 412 to be V6, the relation among V4, V5 and V6 can be expressed by:

$$V5 = V6 - V4.$$

Accordingly, when the potential to be supplied from the gain control circuits 105, 106 to the terminal 424 is lowered according to the increase in the gain control amount, the potential V5 becomes higher, so that a bias is given so as to increase the attenuation amounts of the gain control circuits 103, 104 through a terminal 431 and a diode 414. The diode 414 is inserted so as to prevent the flow of current from the gain control circuits 103, 104 to the operational amplifier 410.

Figure 5:
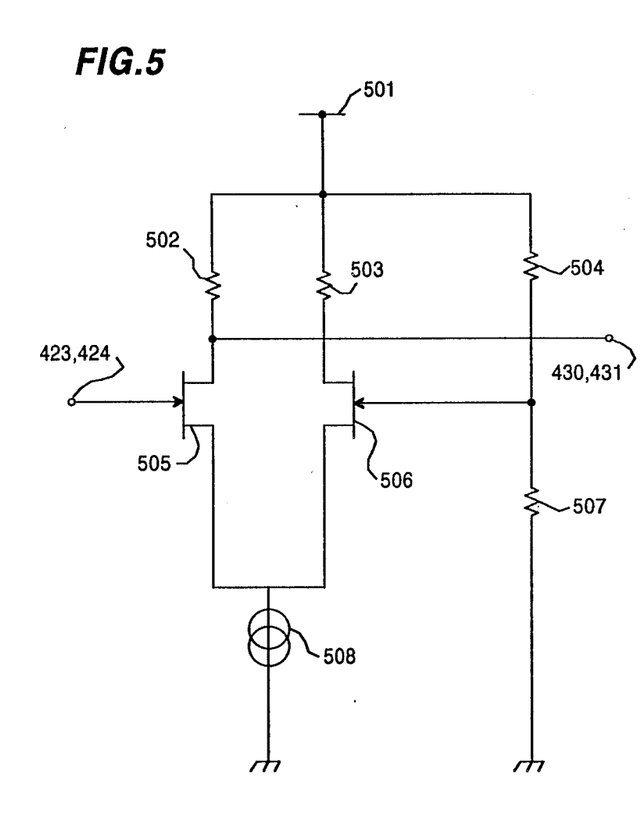
FIG. 5 is a circuit diagram of another embodiment of the bias circuit shown in FIG. 1.

FIG. 5 shows an embodiment in which a differential amplifier is used in place of the operational amplifier in FIG. 4. The differential amplifier is constituted by resistors 502, 503, FETs 505, 506, and a constant current source 508. To the gate of FET 506 there is given a prescribed potential obtained by dividing an operating power source 501 of the differential amplifier by a resistor 504 and a resistor 507.

Figure 6A:
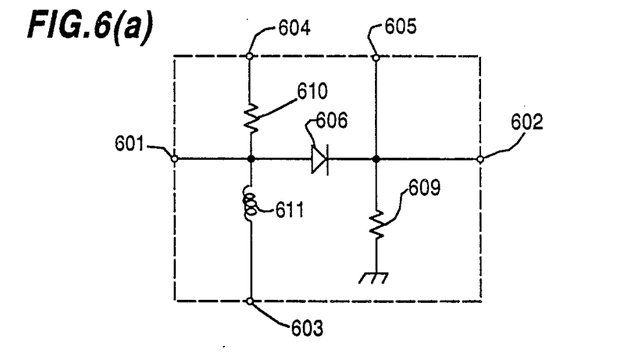
FIGS. 6(a), 6(b), 6(c) are circuit diagrams of embodiments of the gain control circuit shown in FIG. 1.
Figure 6B:
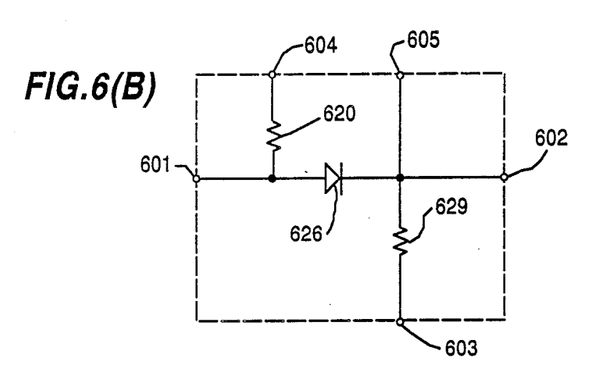
Figure 6C:
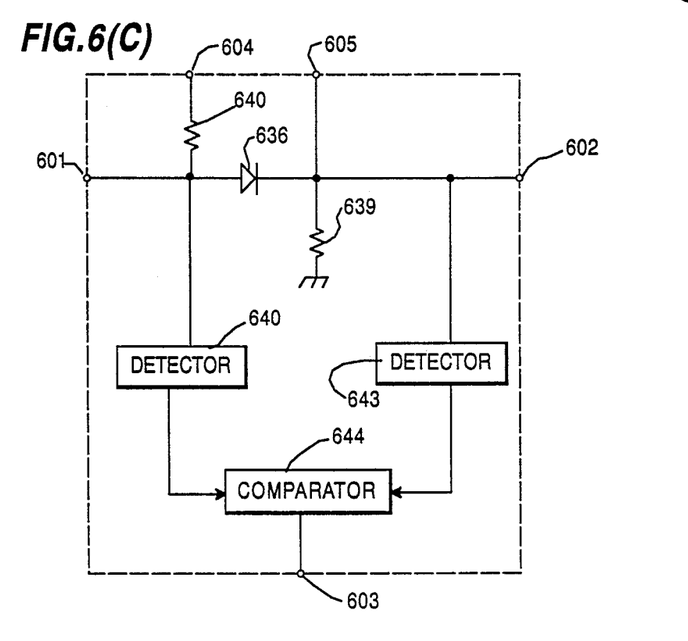

FIGS. 6(a), 6(b) and 6(c) show embodiments of the gain control circuit. In FIG. 6(a), a terminal 601 is an input terminal, and a terminal 602 is an output terminal. The attenuation amount is determined by the current which flows through a terminal 604, a PIN diode 606, and a resistor 609. When the attenuation amount is increased, the current which flows through a resistor 610 is decreased to cause a reduction of the voltage at a terminal 603. When the attenuation amount is decreased, the current which flows through the resistor 610 is increased to cause an elevation of the voltage at the terminal 603. The voltage at the terminal 603 becomes the signal for detection of the control amount. A coil 611 is for blocking AC components. A terminal 605 is a terminal for exerting a reverse bias to the PIN diode 606 from the bias circuit 5 when no current is led to the PIN diode 606, and its gain control amount becomes higher as the higher reverse bias is applied.

In FIG. 6(b), the amount of attenuation is determined by the current led through the terminal 604, a PIN diode 626, and a resistor 629. This current is taken out from the terminal 603 to make into a signal for detecting the control amount.

In FIG. 6(c), the amount of attenuation is determined by the current led through the terminal 604, a PIN diode 636, and a resistor 639. The result of detection of the signals of the cathode and the anode of the PIN diode 636 with detectors 643 and 640 respectively and comparison of the detected outputs with a comparator 644 is made the control amount detection signal.

Figure 7:
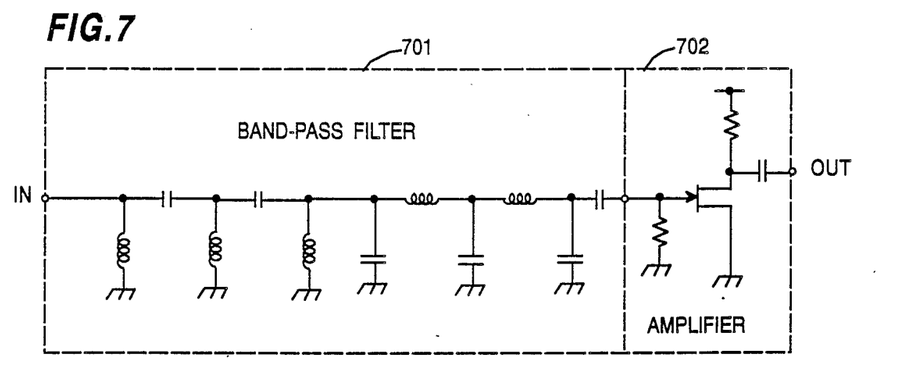
FIG. 7 is a circuit diagram of one embodiment of the filter shown in FIG. 1.

FIG. 7 shows an embodiment of the filter constitution which comprises a filter 701 composed of inductors and capacitors and an amplifier 702. The signal inputted into the amplifier 702 has been subjected to band limitation by the filter 701, so that the distortion in the amplifier 702 is reduced.

Figure 8:
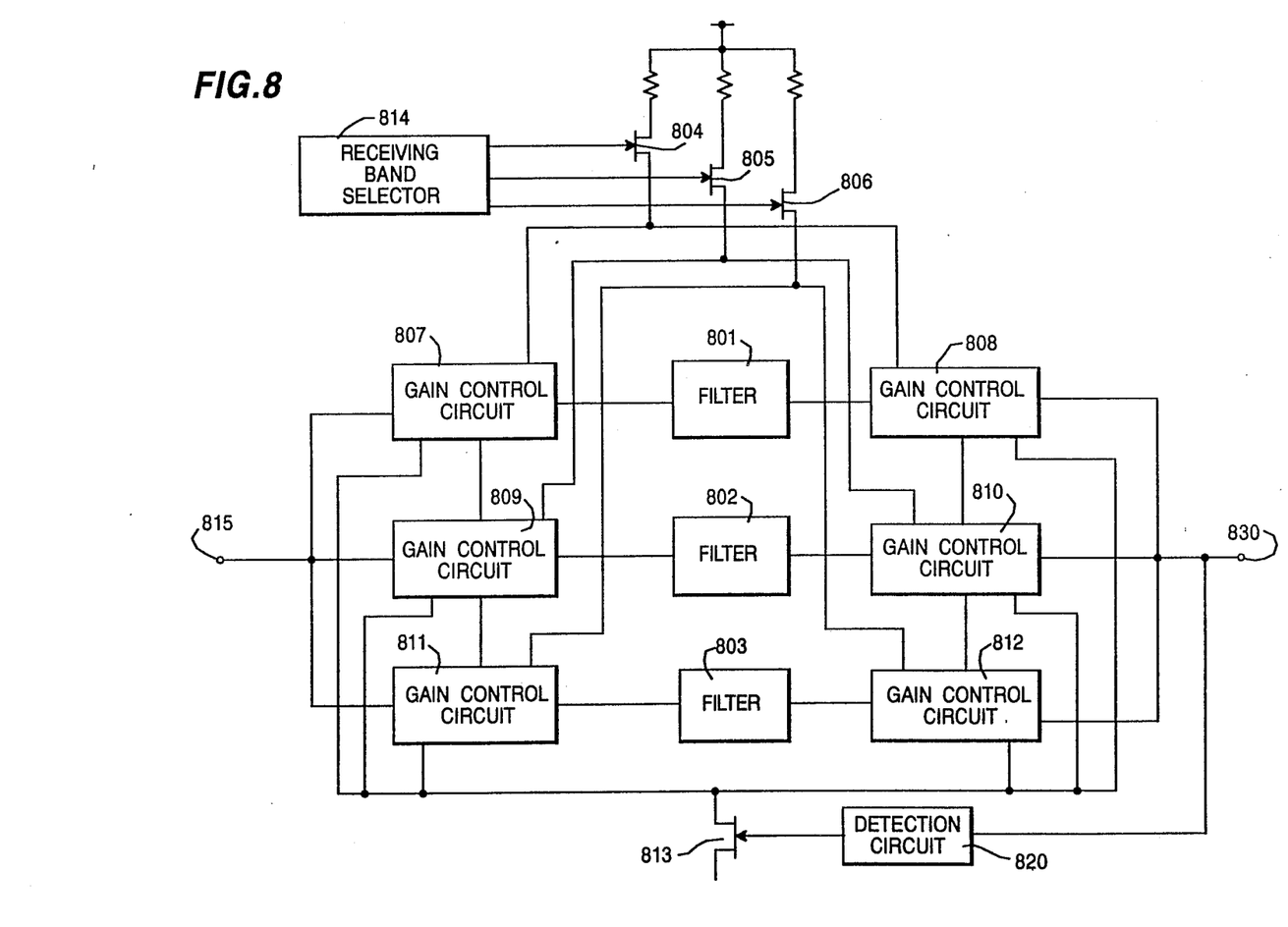
FIG. 8 is a block diagram of a wide band transmission system of another embodiment of the present invention.

FIG. 8 shows another embodiment of the wide band transmission system, in which a filter 801 is a band-pass filter of 50 MHz~200 MHz, a filter 802 is a band-pass filter of 200 MHz~470 MHz, and a filter 803 is a band-pass filter of 470 MHz~800 MHz. Into an input terminal 815 a CATV signal is inputted. An explanation is set forth regarding the case where the frequency of the signal which is desired to be received is within the pass band of the filter 801. By a receiving band selector 814 voltages to turn ON a FET 804, turn OFF a FET 805, and turn OFF a FET 806 are supplied to the gates of FETs 804–806. Accordingly, a current is led to gain control circuits 807 and 808 and not led to gain control circuits 809–812. The current led to the gain control circuits 807 and 808 are controlled by the gate voltage of a FET 813 and the attenuation amounts of the gain control circuits are determined. With respect to the potential of the FET 813, the result of detection of the signal at a terminal 830 with a detection circuit 820 is supplied as a direct current voltage, so that a signal of a certain intensity within the pass band of the filter 801 is obtained at the terminal 830.

As above, an explanation has been given in the case where the frequency of the signal which is desired to be received is in the pass band of the filter 801. The same steps apply to the case where the frequency is in the pass band of the filter 802 or of the filter 803.

What is claimed is:

1. A wide band transmission system for receiving via an input terminal a wide band signal containing a plurality of signals having different frequency bands from each other and selectively transmitting one of the plurality of signals according to a desired frequency band, said system comprising:
    a plurality of parallel transmission paths coupled in parallel to the input terminal and each comprising a gain control means for controlling a gain of a corresponding transmission path and a filter means having a pass band which is different from that of the filter means in each of the other of the plurality of parallel transmission paths;
    a receiving band selecting means for selecting one of the plurality of parallel transmission paths whose filter means has a pass band in which the desired frequency band exists and for producing a selection signal indicative of the thus selected transmission path; and
    a control power source responsive to the selection signal for supplying to the gain control means in the selected transmission path a first control signal for controlling the gain of the selected transmission path so as to pass therethrough a signal of the desired frequency band, and for supplying the gain control means of each of the remaining transmission paths a second control signal for reducing the gains of the remaining transmission paths so as to suppress signals which are to be passed through the remaining transmission paths.

2. A wide band transmission system according to claim 1, further comprising a means for prducing a AGC voltage from the signal of the desired frequency band which has passed through the selected transmission path, the control power source utilizing as the first control signal a voltage proportional to the AGC voltage.

3. A wide band transmission system according to claim 1, further comprising a means for producing an AGC voltage from the signal of the desired frequency band which has passed through the selected transmission path, said control power source utilizing as the first control signal a current proportional to the AGC voltage.

4. A wide band transmission system according to claim 1, further comprising a means for producing an AGC voltage from the signal of the desired frequency band which has passed through the selected transmission path, said control power source comprises a plurality of current sources respectively coupled to the gain control means of the plurality of transmission paths, and each generating a voltage control current having a quantity proportional to the AGC voltage, and a selection circuit responsive to the selection signal for activating one of the plurality of current sources which is coupled to the gain control means in the selected transmission path so that the voltage control current is supplied to the gain control means in the selected transmission path and so that no current is supplied to the gain control means in each of the remaining transmission paths.

5. A wide band transmission system for receiving via an input terminal a wide band signal containing a plurality of signals having different frequency bands from each other and for selectively transmitting one of the plurality of signals according to a desired frequency band among the plurality of signals, said system comprising:
    a plurality of parallel transmission paths coupled in parallel to the input terminal and each comprising a gain control means for controlling a gain of a corresponding transmission path and a filter means having a pass band which is different from that of the filter means in each of the other of the plurality of parallel transmission paths;
    a receiving band selecting means for selecting one of the plurality of parallel transmission paths whose filter means has a pass band in which the desired frequency band exists and for producing a selection signal indicative of the thus selected transmission path;
    a control power source responsive to the selection signal for supplying to the gain control means in the selected transmission path a first control signal for controlling the gain of the selected transmission path so as to pass therethrough the signal of the desired frequency bond, and for supplying to the gain control means in each of the remaining transmission paths a second control signal for reducing the gains of the remaining transmission paths; and
    bias means for supplying the gain control means in each of the remaining transmission paths a bias signal for further reducing the gain of each of the remaining transmission paths.

6. A wide band transmission system according to claim 5, further comprising a means for producing an AGC voltage from the signal of the desired frequency band which has passed through the selected transmission path, said control power source utilizing as the first control signal a voltage proportional to the AGC voltage.

7. A wide band transmission system according to claim 5, further comprising a means for producing an AGC voltage from the signal of the desired frequency band which has passed through the selected transmission path, said control power source utilizing as the first control signal a current proportional to the AGC voltage.

8. A wide band transmission system according to claim 5, further comprising a means for producing an AGC voltage from the signal of the desired frequency band which has passed through the selected transmission path, said control power source comprises a plurality of current sources respectively coupled to the gain control means of the plurality of transmission paths, and each generating a voltage control current having a quantity proportional to the AGC voltage, and a selection circuit responsive to the selection signal for activating one of the plurality of current sources which is coupled to the gain control means in the selected transmission path so that the voltage control current is supplied to the gain control means in the selected transmission path and so that no current is supplied to the gain control means in each of the remaining transmission paths.

9. A wide band transmission system according to claim 5, wherein the gain control means in the selected transmission path supplies a control amount detection signal according to its gain control amount to the bias means.

10. A wide band transmission system according to claim 9, wherein the gain control means in the selected transmission path outputs a current which determines the gain control amount as the control amount detection signal.

11. A wide band transmission system according to claim 9, wherein the gain control means in the selected transmission path outputs a voltage which determines the gain control amount as the control amount detection signal.

12. A wide band transmission system according to claim 9, wherein the gain control means in the selected transmission path as detection means for detecting input and output signals thereof, and comparator means for comparing the intensities of the detected input and output signals, a result of comparison being outputted as the control amount detection signal.

13. A wide band transmission system according to claim 9, wherein the bias means outputs a voltage corresponding to a difference between a prescribed reference voltage and the control amount detection signal as the bias signal.

14. A wide band transmission system according to claim 9, wherein each filter means comprises a passive filter having a predetermined pass band, and an amplifier for amplifying an output of the passive filter.

15. A wide band transmission system according to claim 9, wherein the bias means supplies the bias signal to the gain control means in each of the remaining transmission paths through a diode for preventing reverse flow of current.

* * * * *